United States Patent
Kapur et al.

(10) Patent No.: US 6,615,380 B1
(45) Date of Patent: Sep. 2, 2003

(54) DYNAMIC SCAN CHAINS AND TEST PATTERN GENERATION METHODOLOGIES THEREFOR

(75) Inventors: Rohit Kapur, Cupertino, CA (US); Denis Martin, Palo Alto, CA (US); Thomas W. Williams, Boulder, CO (US)

(73) Assignee: Synopsys Inc.

( * ) Notice: Subject to any disclaimer, the term of this patent is extended or adjusted under 35 U.S.C. 154(b) by 0 days.

(21) Appl. No.: 09/469,729

(22) Filed: Dec. 21, 1999

(51) Int. Cl.[7] .................................................. G06F 11/00
(52) U.S. Cl. ........................ 714/738; 714/728; 714/739
(58) Field of Search ....................... 714/729, 30, 738, 714/724, 726, 728, 739, 733; 364/489

(56) References Cited

U.S. PATENT DOCUMENTS

| | | | | |
|---|---|---|---|---|
| 4,931,722 A | * | 6/1990 | Stoica | 714/733 |
| 5,592,493 A | * | 1/1997 | Crouch et al. | 714/729 |
| 5,703,789 A | * | 12/1997 | Beausang et al. | 364/489 |
| 5,719,879 A | * | 2/1998 | Gillis et al. | 714/726 |
| 5,831,868 A | * | 11/1998 | Beausang et al. | 364/489 |
| 5,925,143 A | * | 7/1999 | Gillis et al. | 714/726 |
| 5,991,898 A | * | 11/1999 | Rajski et al. | 714/30 |
| 6,079,040 A | * | 6/2000 | Hom et al. | 714/738 |
| 6,195,776 B1 | * | 2/2001 | Ruiz et al. | 714/738 |
| 6,269,463 B1 | * | 7/2001 | Duggirala et al. | 714/738 |
| 6,327,687 B1 | * | 12/2001 | Rajski et al. | 714/738 |

* cited by examiner

Primary Examiner—David Ton
(74) Attorney, Agent, or Firm—Bever, Hoffman & Harms LLP; Jeanette S. Harms

(57) ABSTRACT

According to the present invention, during scan conversion, non-scan memory cells of a circuit design are replaced with scan cells to form a scan chain. The scan chain is transformed by the test synthesis tool of the present invention into dynamic scan chains with the addition of reconfiguration circuitry. The reconfiguration circuitry partitions the scan chain into multiple segments and enables each segment to be selectively "bypassed" (or deactivated) during test application. Shorter test patterns that are only pertinent to one or more segments are necessary, resulting in a reduction in overall test data volume and test application time. The present invention also provides a modified ATPG technique for generating test patterns for the dynamic scan chains.

21 Claims, 11 Drawing Sheets

|    | a | b | c | d | e |
|----|---|---|---|---|---|
| T1 | 1 | 0 | 1 | 1 | 1 |
| T2 | 1 | 1 | 1 | 0 | 0 |
| T3 | 1 | 0 | 1 | 1 | 0 |
| T4 | 0 | 1 | X | X | 0 |
| T5 | X | X | 0 | X | 1 |
| T6 | 0 | X | 0 | X | 1 |
| T7 | 0 | X | 1 | 1 | X |
| T8 | X | X | 1 | 0 | 1 |
| T9 | 1 | X | 0 | 1 | X |

FIG. 2A

|     | a | b | c | d | e |
|-----|---|---|---|---|---|
| T10 | 0 | 1 | - | - | 0 |
| T11 | - | - | 0 | - | 1 |
| T12 | 0 | - | 0 | - | 1 |
| T13 | 0 | - | 1 | 1 | - |
| T14 | - | - | 1 | 0 | 1 |
| T15 | 1 | - | 0 | 1 | - |

FIG. 2B

DYNAMIC SCAN CHAINS AND TEST PATTERN GENERATION METHODOLOGIES THEREFOR

FIELD OF THE INVENTION

The present invention pertains to the field of electronic design automation. More particularly, aspects of the present invention pertain to design for test (DFT) methodologies and automatic test pattern generation (ATPG) methodologies.

BACKGROUND OF THE INVENTION

The rapid growth of the complexity of modern electronic circuits has forced electronic circuit designers to rely upon computer programs to assist and automate most steps of the circuit design process. Typical circuits today contain hundreds of thousands or millions of individual pieces or "cells." Such a design is much too large for a circuit designer or even a team of engineers to effectively manage manually. To automate the circuit design and fabrication of integrated circuit devices, electronic design automation (EDA) systems have been developed.

An EDA system is a computer software system designers use for designing integrated circuit (IC) devices. The EDA system typically receives one or more high level behavioral descriptions of an IC device (e.g., in HDL languages like VHDL, Verilog, etc.) and translates this behavioral description into netlists of various levels of abstraction. At a higher level of abstraction, a generic netlist is typically produced based on technology independent primitives. A netlist describes the IC design and is composed of nodes (elements) and edges, e.g., connections between nodes, and can be represented using a directed cyclic graph structure having nodes which are connected to each other with signal lines. The netlist description is typically stored in computer readable media within the EDA system and processed and verified using many Well known techniques. The EDA system ultimately produces a physical device layout in mask form which can be used to directly implement structures in silicon to realize the physical IC device.

An important part of the IC design process involves designing for testability. Programs that aid in the testability process of logic synthesis are called design for test (DFT) processes. As part of DFT, it is known to take a netlist and add and/or replace certain memory cells with special memory cells that are designed to allow the application of test vectors to certain logic portions of the design. Another important step in the IC design process involves generating test patterns to be applied to the DFT implementations. These automatic test pattern generation (ATPG) processes analyze the various representations of the netlist designs and automatically generates test patterns therefrom.

As devices enter the sub-micron era, circuit size is increasing at a very rapid pace. With the increasing circuit size, testing is becoming more and more difficult and test data volumes are becoming unmanageable. The number of tests required to achieve high fault coverage is increasing at an even faster pace. To make the matter worse, deep sub-micron technology is challenging the existing fault models with the possibility of more failure mechanisms and more defect types. More fault models would, in turn, require more test patterns for the same fault coverage and quality level.

The increase in the number of test patterns has a significant impact on the costs associated with testing the integrated circuits. For instance, as the number of tests increases, the time required for testing the ICs will be longer. In addition, automatic testing equipment (ATE) must be constantly upgraded with more and more memory in order to cope with the increasing test data volume.

The problem with test data explosion is recognized by researchers and solutions have been presented to compress and decompress the test patterns. However, those solutions are relatively difficult to incorporate in the test tools currently available from the industry.

Therefore, what is needed is a novel method and system for testing integrated circuit designs. What is further needed is a novel method and system for generating test patterns such that test data volume and test data application time are significantly reduced.

SUMMARY OF THE DISCLOSURE

Accordingly, the present invention provides a design for test (DFT) technique for reducing test data volume and test application time. According to the present invention, during scan conversion, non-scan memory cells of a circuit design are replaced with scan cells to form a scan chain. Significantly, the scan chain is transformed by a test synthesis tool of the present invention into dynamic scan chains with the addition of reconfiguration circuitry. The reconfiguration circuitry partitions the scan chain into multiple segments and enables each segment to be selectively "bypassed" (or deactivated) during test application. In this way, shorter test patterns may be used, resulting in a reduction in overall test data volume and test application time. Because the present invention offers a reduction in the test data volume to achieve the same quality of results, it is ideally suited for application to submicron integrated ciruit design.

The present invention also provides a modified ATPG technique for generating test patterns for dynamic scan chains. In furtherance of one embodiment, during ATPG processing, a test pattern for a potential fault of the design is first generated. Then, the ATPG tool of the present embodiment determines whether the specified bits of the test pattern can be applied by each segment of the dynamic scan chain(s). If all of the specified bits of a test pattern can be applied by one particular segment, the ATPG tool of the present embodiment then removes the unspecified bits that cannot be applied by that segment. As a result test data volume is advantageously reduced.

According to the present invention, if the entire scan chain is required by most of the test patterns, the initial partitioning of the dynamic scan chain(s) may be less that optimum. In that case, it may be desirable to re-partition the dynamic scan chain. In one embodiment, the partitioning may be selected by topological checks of the circuit design (e.g., circuit traversal analysis). In another embodiment, the initial partitioning may be generated randomly and subsequently refined through multiple iterations. Further, in one embodiment, the desired number of partitions within a dynamic scan chain may be parameterizable.

Embodiments of the present invention include the above and further include a computer readable memory having stored therein computer readable program code for causing a computer system to perform a method implementing design for test (DFT) circuitry in an integrated circuit design. The method of the present embodiment includes steps of: (a) receiving a netlist description of an integrated circuit design, the netlist description including a plurality of memory cells; (b) replacing the plurality of memory cells with a plurality of scan cells; (c) interconnecting the plurality of scan cells with a plurality of nets to form a scan chain; (d) selecting respective ones of the plurality of nets for insertion of reconfiguration circuitry; and (e) inserting reconfiguration circuitry at the respective nets, wherein the reconfiguration circuitry enables segments of the scan chain to be selectively bypassed during test application.

BRIEF DESCRIPTION OF THE DRAWINGS

The accompanying drawings, which are incorporated in and form a part of this specification, illustrate embodiments of the present invention and, together with the description, serve to explain the principles of the invention.

FIG. 2A illustrates a number of exemplary test patterns generated using conventional automatic test pattern generation (ATPG) techniques for a scan chain.

FIG. 2B illustrates a number of exemplary test patterns applicable to a dynamic scan chain of an embodiment of the present invention.

DETAILED DESCRIPTION OF THE PREFERRED EMBODIMENTS

Figure 1:
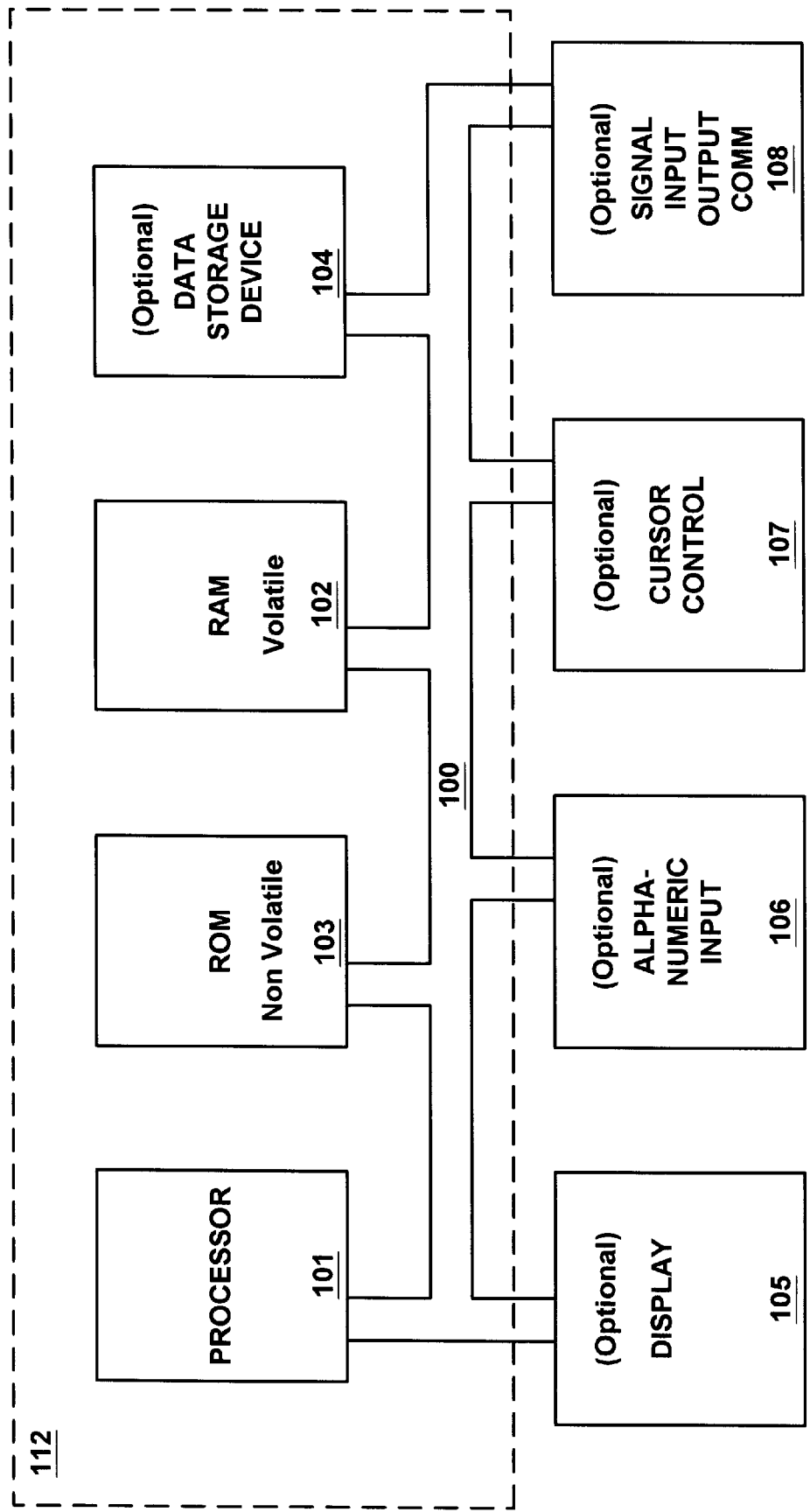
FIG. 1 illustrates a computer system operable as a platform on which embodiments of the present invention may be implemented.

In the following detailed description, for purposes of explanation, numerous specific details are set forth in order to provide a thorough understanding of the present invention. However, it will be apparent to one skilled in the art that the present invention may be practiced without these specific details. In other instances, well-known structures and devices are not described in detail in order to avoid obscuring aspects of the present invention.

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here and generally conceived to be a self-consistent sequence of steps of instructions leading to a-desired result. The steps are those requiring physical manipulations of data representing physical quantities to achieve tangible and useful results. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "accessing", "determining", "generating", "associating", "assigning" or the like, refer to the actions and processes of a computer system, or similar electronic computing device. The computer system or similar electronic device manipulates and transforms data represented as electronic quantities within the computer system's registers and memories into other data similarly represented as physical quantities within the computer system memories into other data similarly represented as physical quantities within the computer system memories or registers or other such information storage, transmission, or display devices.

Aspects of the present invention (e.g., FIG. 6, FIG. 7, FIG. 8 and FIG. 9) are discussed in terms of steps executed on a computer controlled EDA system. These steps are implemented as program code stored in computer readable memory units of a computer system and are executed by the processor of the computer system. Although a variety of different computer systems can be used with the present invention, an exemplary general purpose computer system 112 is shown in FIG. 1.

In general, computer system 112 includes an address/data bus 100 for communicating information, a central processor 101 coupled with the bus for processing information and instructions, a volatile memory 102 (e.g., random access memory RAM) coupled with the bus 100 for storing information and instructions for the central processor 101 and a non-volatile memory 103 (e.g., read only memory ROM) coupled with the bus 100 for storing static information and instructions for the processor 101. Computer system 112 also includes a data storage device 104 ("disk subsystem") such as a magnetic or optical disk and disk drive coupled with the bus 100 for storing information and instructions and a display device 105 coupled to the bus 100 for displaying information to the computer user. Data storage device 104 can include one or more removable magnetic or optical storage media (e.g., diskettes, tapes) which are computer readable memories. It is appreciated that data produced at the various logic synthesis stages of the present invention, including representations of the different levels of abstraction of the integrated circuit design, such as a netlist, can also be stored in RAM 102, ROM 103 or the storage device 104.

Also included in computer system 112 of FIG. 1 is an alphanumeric input device 106 including alphanumeric and function keys coupled to the bus 100 for communicating information and command selections to the central processor 101. Computer system 112 also includes a cursor control or directing device 107 coupled to the bus for communicating user input information and command selections to the central processor 101. Computer system 112 can also include an optional signal generating device 108 coupled to the bus 100 for interfacing with other networked computer systems. The display device 105 utilized with the computer system 112 of the present invention may be a liquid crystal device, other flat panel display, cathode ray tube, or other display device suitable for creating graphic images and alphanumeric characters recognizable to the user.

Figure 3A:
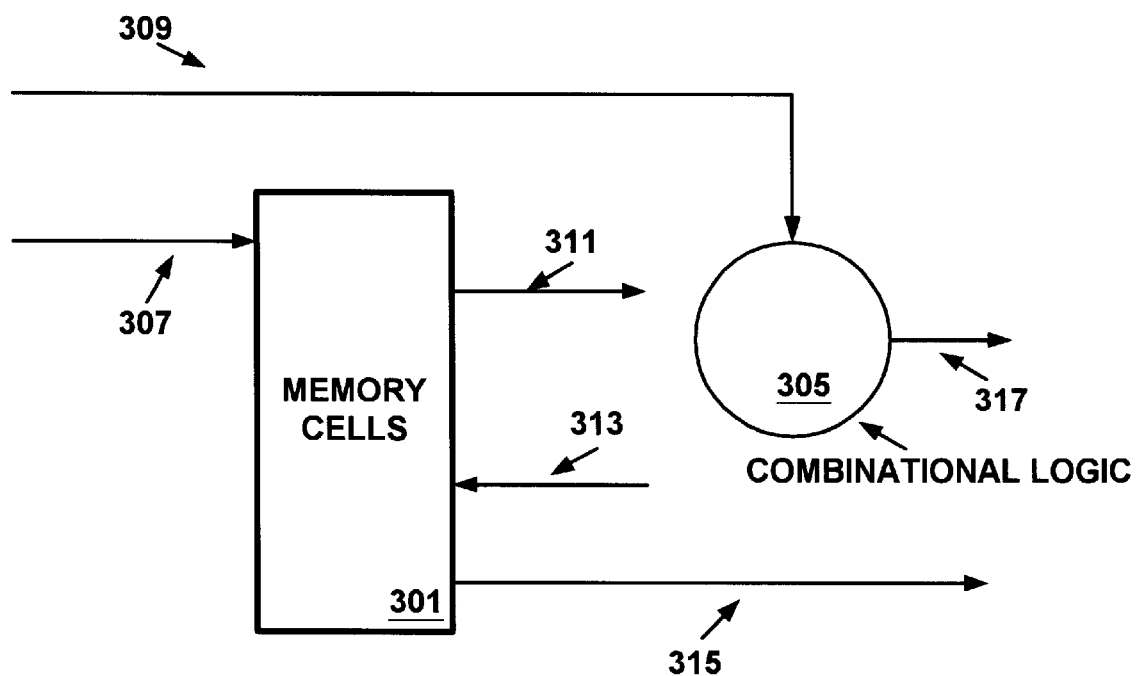
FIG. 3A illustrates a circuit model utilized by the present invention to represent a logic unit of an integrated circuit.

FIG. 3A illustrates a circuit model 300 utilized by the present invention to represent a logic unit of an integrated circuit. The model 300 includes a memory cell block 301 that outputs signals over line 311 to a combinational logic block 305. Combinational logic 305 also outputs signals over line 313 to drive inputs of the memory cells 301. Memory cells 301 receives a primary input signal 307 which typically originates off chip. Memory block 301 generates a primary output signal 315 that goes off chip and combinational logic block 305 also generates a primary output signal 317 that goes off chip. According to the circuit model 300, memory block 301 is composed either of edge sensitive memory cells (e.g., flip-flops) or level sensitive memory cells (e.g., latches or registers) or can be composed of other cell types. A variety of memory modes or styles, including either of the memory modes described above, may also present in circuit model 300.

As shown by FIG. 3A, portions of combinational logic 305 that are directly stimulated by primary input 309 and that are directly coupled by its output to primary line 317, can be readily tested for faults by direct application of test vectors (e.g., predetermined test data patterns) over line 309 and by direct observation of the output over line 317. However, this represents only a small percentage of the logic of block 305. In typical applications, most of the logic gates within block 305 receive their inputs from memory cells within 301 and forward their outputs to other memory cells within 301. In order to accurately test the combinational logic within block 305, DFT processes provide a mechanism for isolating different logic groups within block 305 by (1) directly loading test vectors into the memory cells 301; (2) storing the outputs of the stimulated logic in the memory cells 301; and then (3) recalling the output from stimulated portions of block 305 from memory 301.

In effect, test vectors are scanned into the memory cells during test mode, then combinational logic is stimulated and its output is then captured in the memory cells to be scanned out.

Figure 3B:
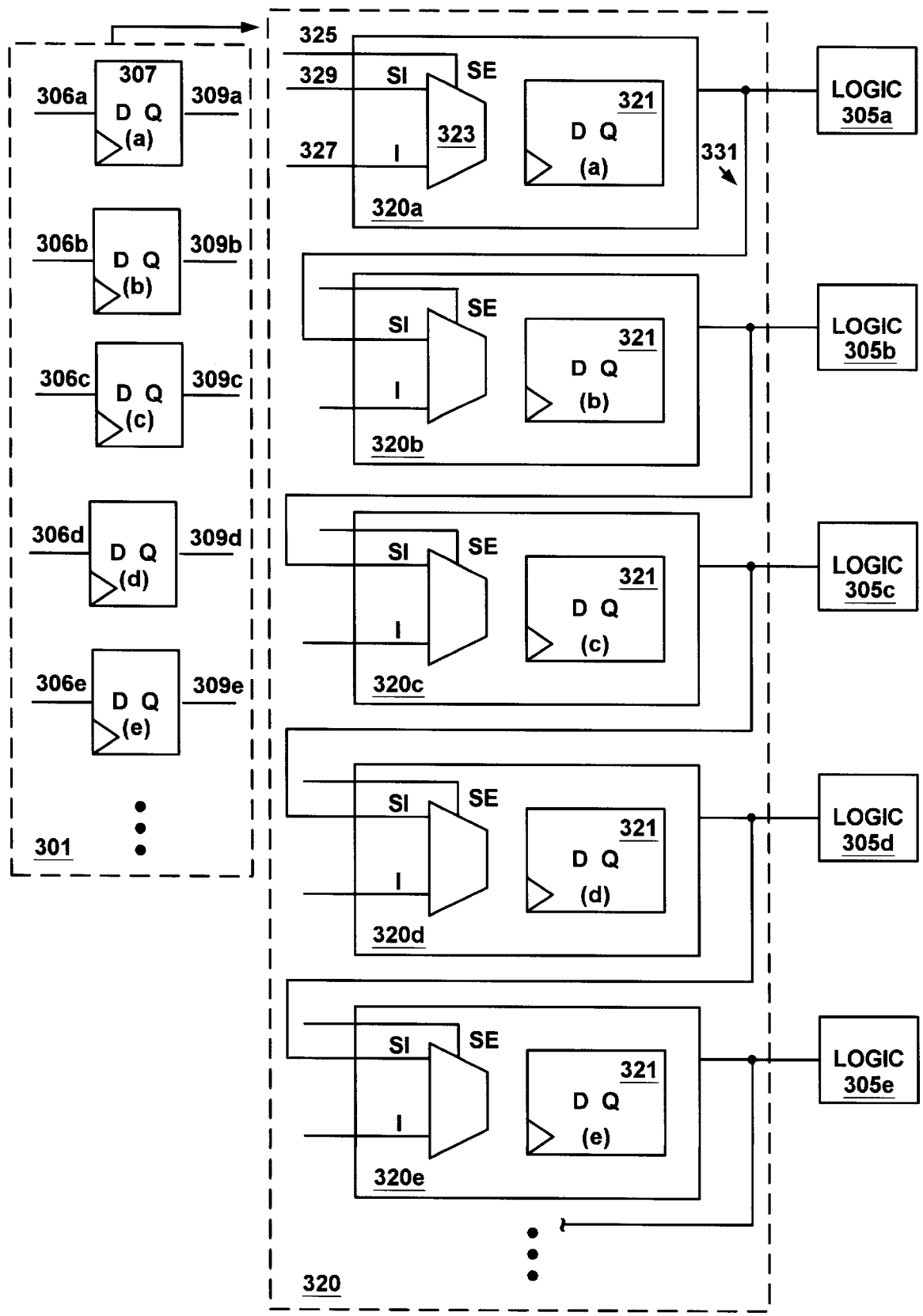
FIG. 3B illustrates the results of a scan replacement process that replaces memory cells with scan cells.

FIG. 3B illustrates a portion of the memory unit 301 as typically specified or inferred in an HDL circuit description without the addition of test circuitry. Unit 301 consists of a number of individual non-scan memory cells. In this example, five exemplary D flip-flops 307a–307e are illustrated. Each nonscan memory cell 307a–307e receives an input 306a–306e from either a primary input off chip, from the combinational logic block 305, or from another memory cell-within block 301. These non-scan memory cells also have outputs 309a–309e that typically drive combinational logic gates or other memory cells or can be a primary output that goes off chip.

Also illustrated in FIG. 3B are the results of a conventional scan replacement process that replaces the non-scan memory cells 307a–307e of unit 301 with scannable memory cells 320a–320e, and links them together to form a scan chain 320. The scan chain 320 provides important design for test (DFT) functionality and allows loading of test vectors into the cells and scanning of data out of the cells in response to the application of the test vectors.

The scannable memory cells 320a–320e in this example consist of multiplexed input D flip-flops and each scannable memory cell can be analogous to each other. For simplicity, only one cell is described herein. Scannable cell 320a contains a memory cell 321a and a multiplexer 323. The D input of cell 321a is coupled of the output of a multiplexer 323 which has a select line input 324, called the scan enable or SE line. The data inputs to the bypass mux 323 are (1) an I (in) input 327 analogous to input 306a from unit 301 and (2) an SI (scan-in) shift input 329 which originates from a previous scannable memory cell or from a primary input provided cell 320a is the first cell in a scan chain. It is appreciated that the output of the mission mode logic 305a is typically routed to the I inputs 327 of the scannable memory cells for observation or to a primary output. The output 331 of cell 321a–is routed to mission mode circuitry 305a of the combinational logic 305 and is also routed to another scannable memory cell (e.g., 320b) or to a primary output, if this cell is the last cell of a scan chain.

The circuitry show in unit 320 has two modes, mission and test. In mission mode, the SE lines are not asserted and data is selected by the bypass mux from the I inputs. In test mode, the SE inputs of each scannable memory cell 320a–320e are asserted such that the shift inputs SI are active and a test pattern can be inserted into the integrated circuit though a primary input and shifted through the scannable memory cells 320a–320e and then applied to the appropriate logic 305a–305e coupled thereto. The product information generated by the test logic is then shifted out to a primary output for observation. In this manner, testability of the integrated circuit is greatly enhanced as sequential logic can be isolated and tested as combinational logic.

Generally, conventional ATPG is an iterative process that includes the following steps: (1) generate a test pattern for an undetected fault; (2) attempt to detect additional undetected faults using the same test pattern; (3) attempt to detect more faults by randomly filling the unspecified inputs of the test pattern; and (4) fault simulate the test pattern to mark off additional detectable faults. FIG. 2A illustrates several exemplary test patterns generated using conventional automatic test pattern generation (ATPG) techniques for scan chain 320. As illustrated in FIG. 2A, exemplary test patterns T1–T3 require all five scan cells 320a–320e (of FIG. 3B) for fault detection. Exemplary test patterns T4–T10, however, require only some of the scan cells 320a–320e for fault detection. Unspecified inputs of the test patterns T4–T10 are each denoted by an "X". In conventional ATPG methodologies, the unspecified inputs will be randomly filled with "0" or "1". Then, a fault simulation step is performed to mark off additional faults detected by the randomly filled T4–T10.

Test patterns created at the beginning of a conventional test generation process run are very effective in detecting faults. Every pattern may detect a large number of faults. However, towards the end of the run, every test pattern may detect only a single fault. Approximately 90% of the patterns are generated to detect the last 10% of the faults. As far as fault detection is concerned, there is no impact of the filling in of the unspecified positions of the test pattern towards the end of the test generation process. In other words, the step of random filling the unspecified positions of the test patterns for the last 10% of the faults does not contribute to the effectiveness of the test patterns. Rather, the randomly filled positions add significantly to the test data volume. Thus, the problem of test data explosion would be alleviated if the randomly filled positions of the test patterns can be avoided.

In conventional DFT methodologies, scan chains (e.g., scan chain 320) have been treated as rigid structures to provide the control and observability to the internal memory cells of the design. As a result, all the test patterns created by an ATPG tool use the same scan structure to apply the patterns. Since the purpose of a scan chain is to apply the test pattern, the present invention recognizes that the ideal scan chain for a pattern is one that includes only the scan cells specified in the test pattern. Approximately, for 90% of the patterns, only 10% of the scan cells of the scan chain are needed. However, these 10% of the scan cells are never the same ones. The present invention recognizes that each test patten should have its own scan chain and that test data volume can be significantly reduced if every test pattern is applied by its own scan chain. According to the present embodiment, goals of the present invention can be achieved by building reconfigurable scan chains such that the scan chains can be dynamically configured during test application according to test patterns requirements.

Figure 4:
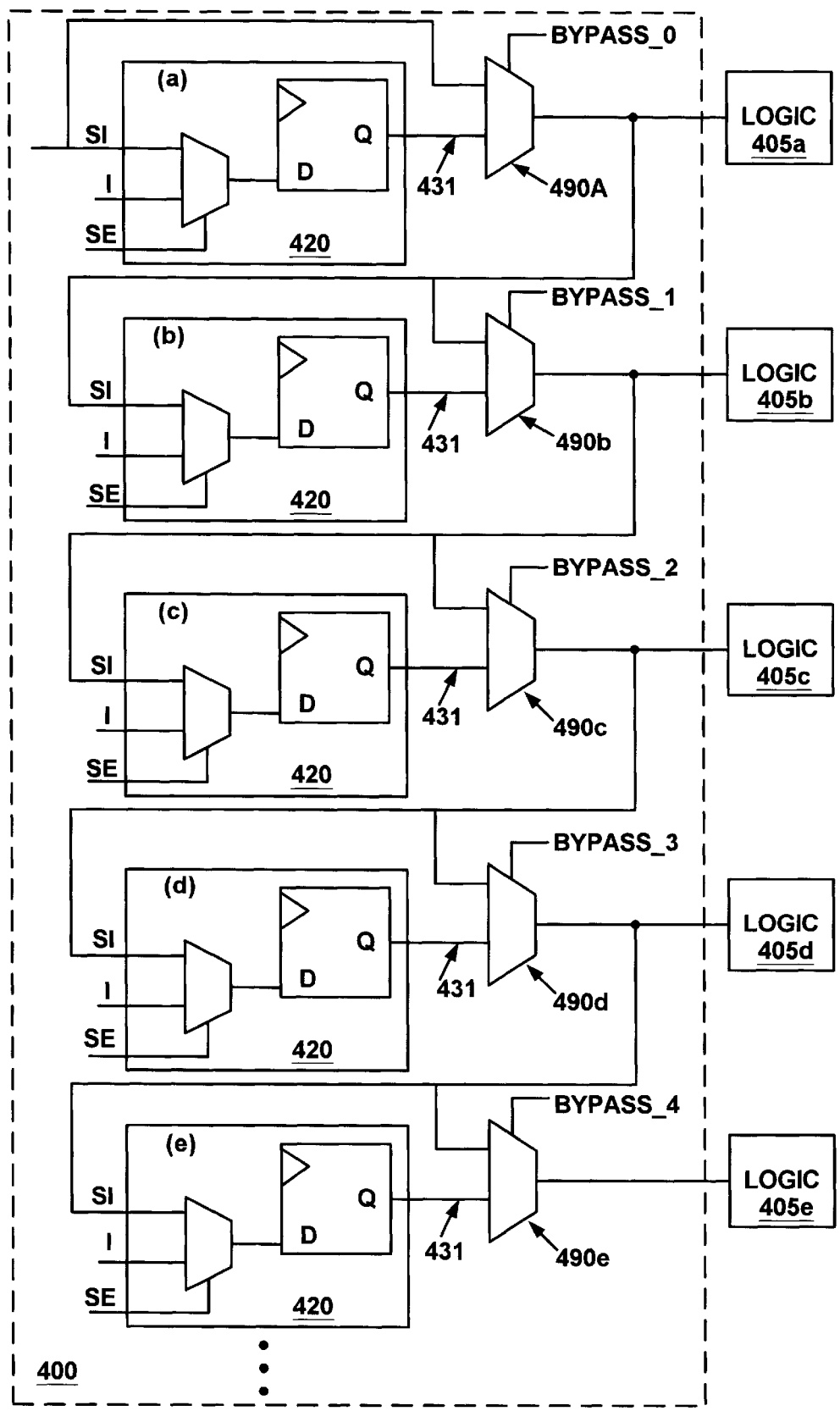
FIG. 4 illustrates a circuit diagram of a portion of a dynamically reconfigurable scan chain implemented according to an embodiment of the present invention.

FIG. 4 illustrates a logical block diagram of a portion of a dynamically reconfigurable scan chain 400 implemented according to an embodiment of the present invention. In the illustrated embodiment, the scannable-memory cells 420a–420e consist of multiplexed input D flip-flops and are analogous to scan memory cells 320a–320e of FIG. 3B. Further, reconfigurable scan chain 400 of the present embodiment includes reconfiguration logic for dynamically configuraing scan segments. In the illustrated embodiment, reconfiguration logic includes bypass multiplexers or bypass muxes 490a–490e.

Specifically, in the illustrated embodiment, the output 431 of cell 420a is coupled to a first input of bypass mux 490a. The SI input of the cell 420a is coupled to other scannable memory cells or a primary input if cell 420a is the first cell of the scan chain 400. Additionally, the SI input of the cell 420a is coupled to a second input of the bypass mux 490a. The output of the bypass mux 490a is routed to mission mode circuitry 405a of the combinational logic 405 and is also routed to another scannable memory cell 420b or to a primary output, if this cell 420a–is the last cell of a scan chain 400. When the first input of the bypass mux 490a is selected, the scan cell 420a will be included in the scan path. When the second input of the bypass mux 490a is selected, the scan cell 420a will be excluded (or "bypassed") in the scan path. Bypass muxes 490a–490e are controlled by configuration signals BYPASS_0, BYPASS_1, BYPASS_2, BYPASS_3, and BYPASS_4, respectively.

In the present embodiment, when the configuration signals are asserted, the corresponding bypass muxes 490a–490e select their respective second inputs such that the scan cells 420a–420e may be selectively bypassed. Scan cells 420b-420e and bypass muxes 490b-490e are configured similarly to scan cell 420a and bypass mux 490a, and are not described further herein for simplicity.

According to the present embodiment, during mission mode (e.g., when SE lines are not asserted), the configuration signals are not asserted such that normal operations of the integrated circuit design can be carried out. During test mode (e.g., when SE lines are asserted), each scan cell 420a–420e could be included or bypassed with the appropriate assertion of the configuration signals. For example, scan cell 420a could be bypassed when BYPASS_0 is asserted, and scan cell 420d could be bypassed when BYPASS_3 is asserted. FIG. 2B illustrates several exemplary test patterns T10–T15 applicable to scan chain 400 of the present embodiment. As illustrated in FIG. 2B, exemplary test patterns T10–T15 require only some of the scan cells 420a–420e to be included in the scan path. For instance, test pattern T10 requires only scan cell 420a, 420b and 420e; and test pattern T14 requires only scan cell 420c, 420d and 420e to be included. The unspecified inputs are marked with and the corresponding scan cells are bypassed by the assertion of the appropriate configuration signals. For example, when test pattern T10 is applied, configuration signals BYPASS_2 and BYPASS_3 are asserted to bypass scan cells 420c and 420d. The resultant dynamically constructed scan chain is then made of scan cells 420a, 420b and 420e.

Importantly, according to the present embodiment of the invention, unspecified inputs of the test patterns are not randomly filled. Rather, the unspecified inputs of the test patterns are discarded, resulting in much shorter test patterns. Another significant advantage of the present embodiment is that a shorter test application time will be required as the length of most of the test patterns to be scanned in is decreased.

Implementations of the embodiment of the present invention as illustrated in FIG. 4 may cause routing problems in certain integrated circuit designs using certain design methodologies. Accordingly, the present invention also provides DFT and ATPG techniques that achieve a significant saving in test data volume and test application time without causing routing problems.

Figure 5:
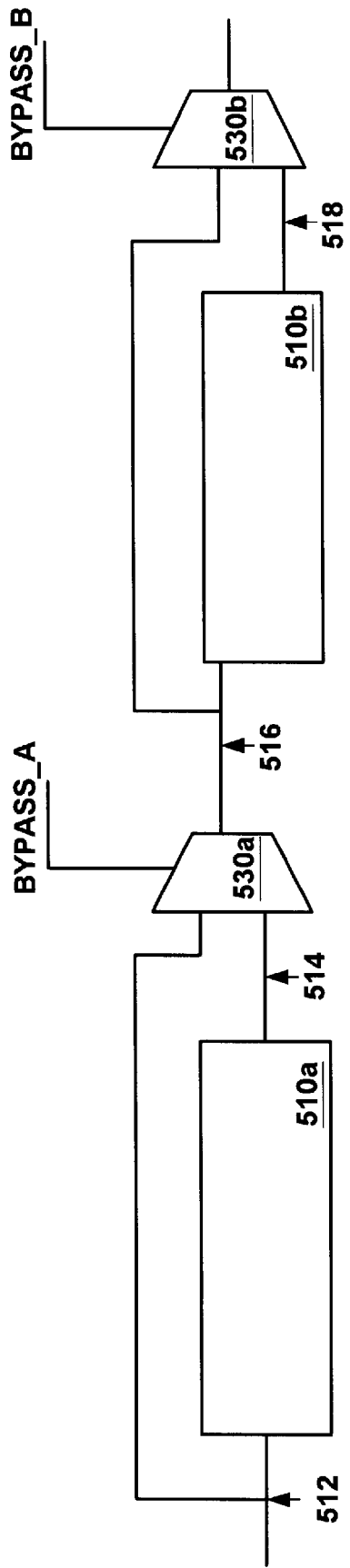
FIG. 5 illustrates a logical block diagram of a dynamically reconfigurable scan chain according to another embodiment of the present invention.

FIG. 5 illustrates a logical block diagram of a dynamically reconfigurable scan chain 500 that is also easily routable according to another embodiment of the present invention. As illustrated, scan chain 500 includes two segments 510a and 510b coupled to two bypass muxes 530a and 530b. Scan chain segments 510a and 510b include scannable memory cells (e.g., scannable memory cells 420a–420e). The input 512 of the segment 510a may be coupled to other scannable memory cells or a primary input. The input 512 of the segment 510a is also coupled to a first input of bypass mux 530a. The output of the segment 510a is coupled to a second input of bypass mux 530a. The output of the bypass mux 530a is coupled to the input 516 of segment 510b and to a first input of bypass mux 530b. The output 518 of segment 510b is coupled to a second input of bypass mux 530b. Further, as illustrated, bypass muxes 530a–530b are respectively controlled by configuration signals BYPASS_A and BYPASS_B.

In operation, scan chain 500 can be dynamically reconfigured into one of three different scan configurations: a full scan with both segments 510a and 510b included as a single chain, a partial scan with segment 510a only or another partial scan with segment 510b only. More specifically, in the present embodiment, segments 510a and 510b are included in the scan path when BYPASS_A and BYPASS_B are not asserted. Segment 510a is excluded when BYPASS_A is asserted and segment 510b is excluded when BYPASS_B is asserted. Routing congestion is released in this case because reconfiguration logic of scan chain 500 includes only two bypass muxes 530a and 530b.

According to an embodiment of the present invention, a dynamic scan chain may be created by a modified scan replacement process that inserts reconfiguring points (e.g., bypass muxes 530a and 530b) between scan cells. It should be noted that the reconfiguration points of a scan chain may be determined in a various number of ways. For instance, topological checks of the design looking at cones of logic to determine the appropriate reconfiguration points. Topology checking methodologies are well known in the art, and are therefore not described herein to avoid obscuring aspects of the invention. Additionally, the reconfiguration points may also be selected based on routability of the design. Further, the number of reconfiguration points could be parameterizable.

During ATPG and before filling in the unspecified positions of a test pattern, a test pattern generation process of the present embodiment determines which scan configuration is the most appropriate for that test pattern. Thereafter, the test pattern generation process of the present embodiment randomly fills in the unspecified positions for the appropriate scan configuration. For example; if a test pattern only uses segment 510a, the test pattern generation process of the present embodiment will only randomly fill the unspecified positions of the test pattern that are applied by segment 510a. The unspecified positions of the test pattern that pertains to segment 510b, however, will not be randomly filled. In this way, test data volume and test application time could be significantly reduced without causing routing problems.

Figure 6:
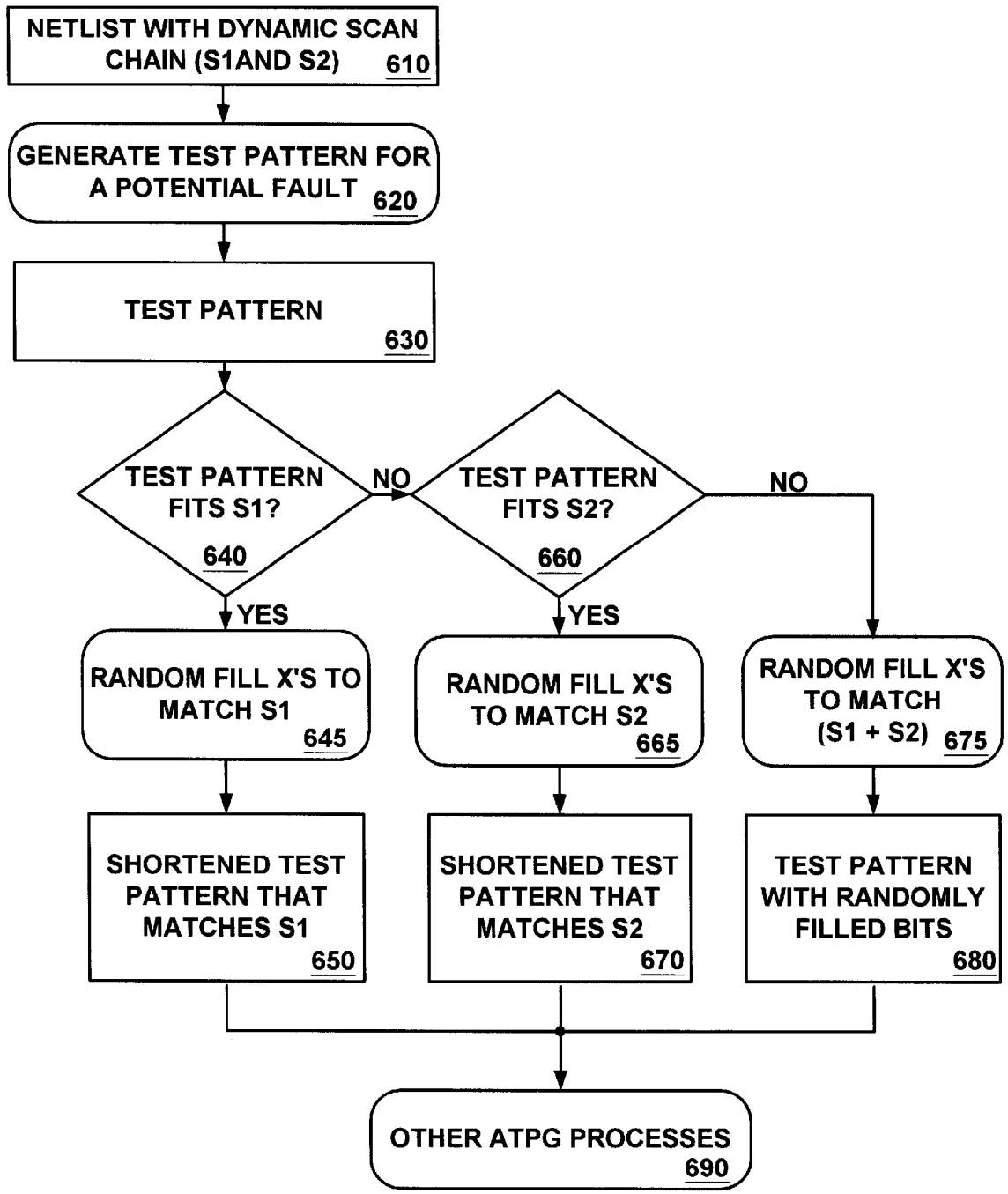
FIG. 6 is a flow diagram illustrating steps of a process of test pattern generation for reconfigurable scan chain of FIG. 5 in accordance with an embodiment of the present invention.

FIG. 6 is a flow diagram illustrating a process 600 of test pattern generation for reconfigurable scan chain 500 in accordance with an embodiment of the present invention. Process 600 begins with a netlist 610 of a circuit design that includes the dynamic scan chain 500. For simplicity, in the following discussion with respect to FIGS. 5 and 6, it is assumed that segment 510a includes four scan cells numbered 0 to 3 and segment 510b includes four scan cells numbered 4 to 7. However, it should be noted that, in other embodiments of the present invention, a dynamic scan chain may include more than two segments and that each segment may have fewer/more than four scan cells.

At step 620, attest pattern 630 is generated for an undetected fault of the integrated circuit design. This step 620 is sometimes referred to as deterministic test pattern generation. Step 620 is well known in the art and is therefore not described herein in detail to avoid obscuring aspects of the invention. In the present example, the test pattern 630 would have eight positions corresponding to the eight scan cells of the dynamic scan chain. Some of the positions of test pattern 630 would be unspecified because some bits may not be required for detecting the fault.

At step 640, it is determined whether the test pattern 630 "fits" segment 510a of the dynamic scan chain. In accordance with the present invention, a test pattern "fits" a segment of the dynamic scan chain if the test pattern only requires that segment for application of the test data. In this example, a test pattern 00X1 XXXX would fit the segment 510a but not the segment 510b. A test pattern XXXX1011 would fit the segment 510b but not the segment 510a.

At step 645, if it is determined that the test pattern 630 fits segment 510a, the process 600 of the present invention fills in the unspecified positions of the test pattern 630 that correspond to segment 510a. For example, a test pattern 00X1XXXX that fits segment 510a would be randomly filled to generate a partially filled test pattern 0001XXXX or 0011XXXX.

At step 650, the test pattern 630 is shortened by removing the unspecified inputs that do not correspond to segment 510a. For instance, a test pattern 0001XXXX is shortened to 0001. Thereafter, at step 690, other ATPG processes, such as fault simulation, are applied.

If it is determined that the test pattern 630 does not fit segment 510a, then at step 660, it is determined whether the test pattern fits segment 510b.

At step 665, if it is determined that the test pattern 630 fits segment 510b, the process 600 of the present invention fills in the unspecified positions of test pattern 630 that correspond to segment 510b. For example, a test pattern XXXX11X0 that matches segment 510a would be randomly filled to generate a partially filled test pattern XXXX1110 or XXXX1100.

At step 670, the test pattern 630 is shortened by removing the unspecified inputs that do not fit segment 510b. Thereafter, other ATPG processes are applied at step 690.

At step 675, if it is determined that the test pattern 630 does not fit segment. 510b, then the test pattern 630 requires the full scan configuration for test application. The process 600 of the present invention fills in the unspecified positions of the entire test pattern. For example, a test pattern 10XX01XX will be randomly filled to become 10110111 or 10100100. Thereafter, other ATPG processes are applied at step 690.

The effectiveness of the DFT and ATPG techniques of the present embodiment in reducing in test data volume may be attributable to how the scan chain is partitioned. If the test pattern generation process ends up using the longest scan configuration every time, the reconfiguration points of the scan chains were badly selected. Thus, an embodiment of the present invention also provides a process of selecting appropriation location for insertion of reconfiguration points.

Figure 7:
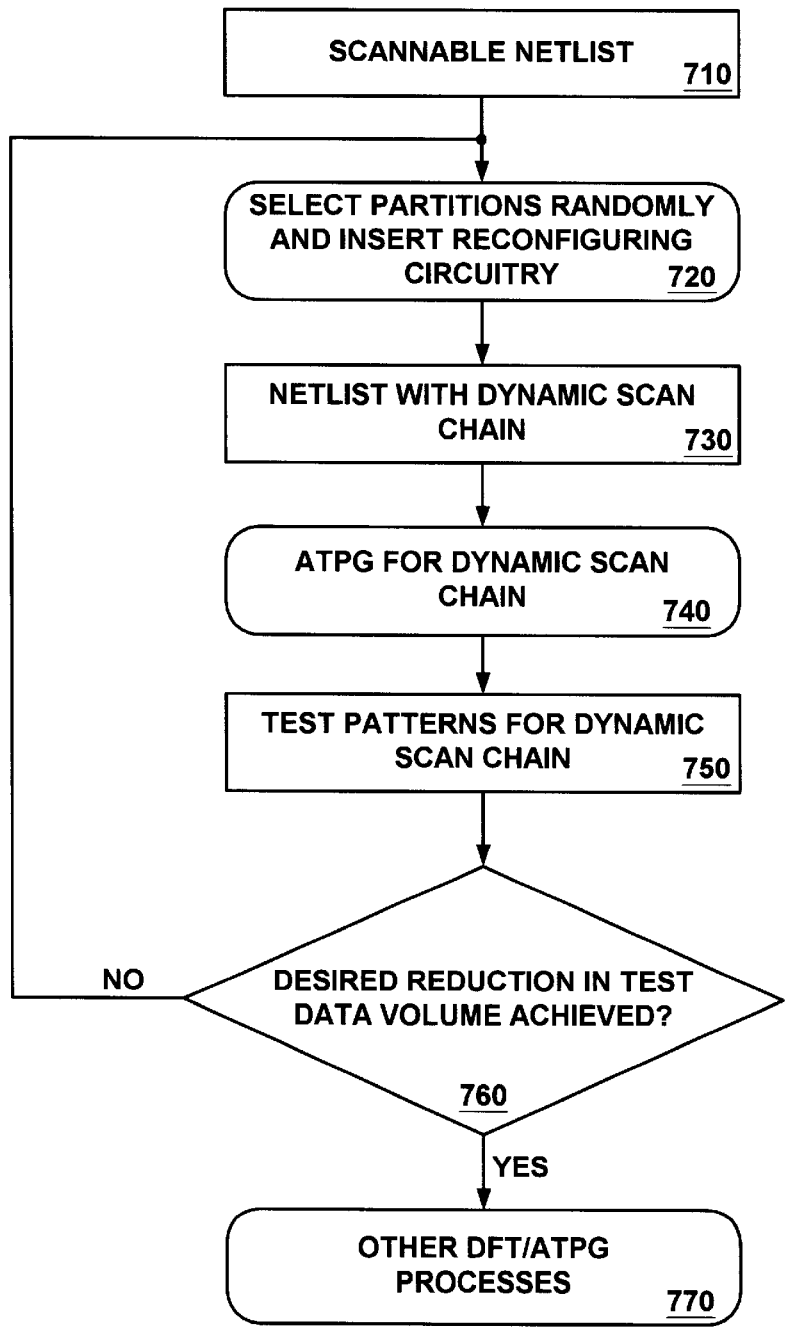
FIG. 7 is a flow chart diagram illustrating steps of a process of selecting reconfiguration points within a scan chain in furtherance of one embodiment of the present invention.

FIG. 7 is a flow chart diagram of a process 700 of selecting reconfiguration points in furtherance of one embodiment of the present invention. As illustrated, at step 720, partitions are selected randomly from a scannable netlist. Further, at step 720, reconfiguring circuitry (e.g., reconfiguration bypass muxes) is inserted according to the selected partitioning. A netlist with dynamic scan chain 730 is generated by step 720.

At step 740, an ATPG process is performed on the netlist with dynamic scan chain 730. According to an embodiment of the present invention, the ATPG process of step 740 is analogous to process 600 and generates test patterns 750 that are specifically targeted at the dynamic scan chain.

At step 760, it is determined whether a desired reduction in test data volume is achieved. Sometimes, most of the test patterns 750 require the entire dynamic scan chain. In that case, steps 720–750 are repeated until a desired reduction in test data volume is reached.

At step 770, once the desired reduction in test data volume is reached, other DFT/ATPG processes may be carried out to further compact the test data.

Figure 8:
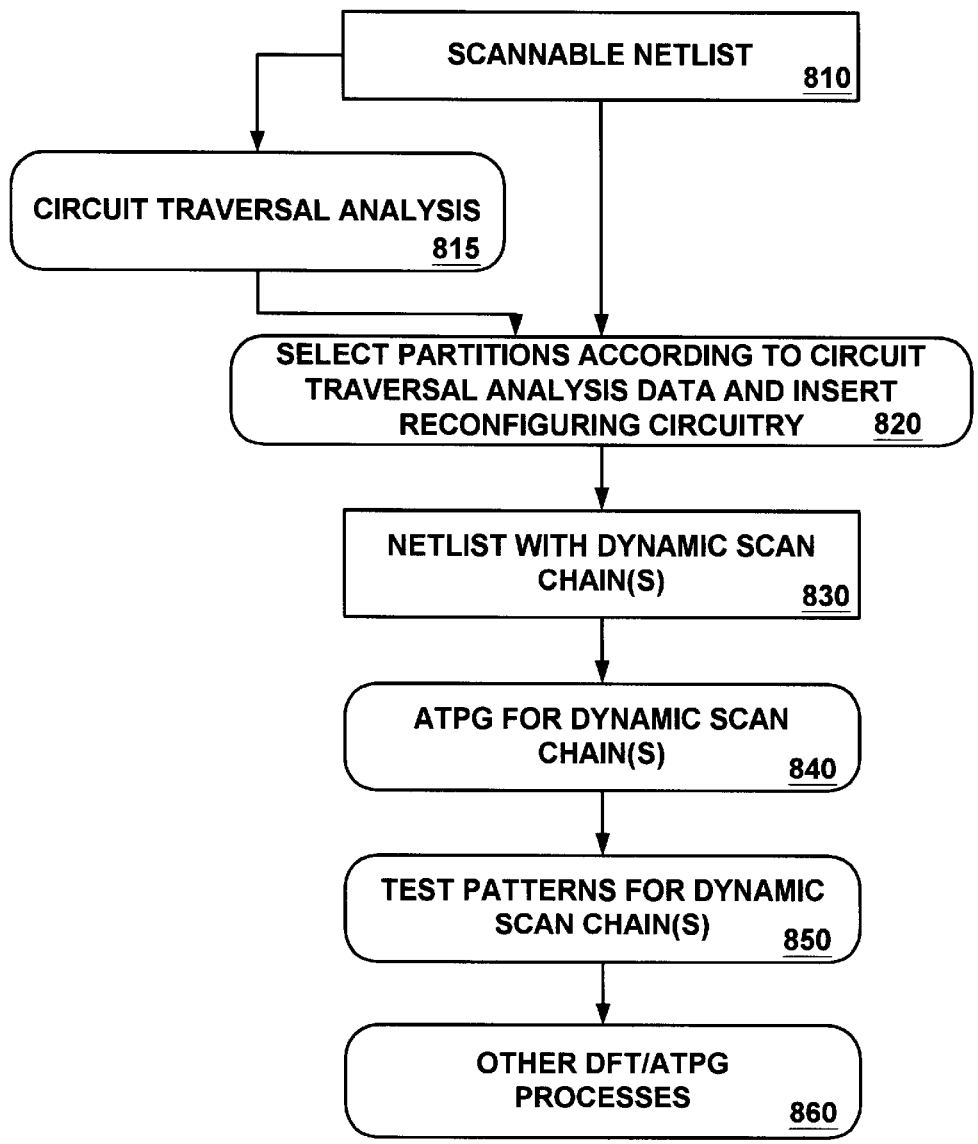
FIG. 8 is a flow chart diagram illustrating steps of a process of selecting reconfiguration points in furtherance of another embodiment of the present invention.

FIG. 8 is a flow chart diagram of a process 800 of selecting reconfiguration points in furtherance of another embodiment of the present invention. As illustrated, at step 815, a circuit traversal analysis looking at cones of logic is performed on a scannable netlist 810 that includes a scan chain. Essentially, circuit traversal analysis determines groups of scan cells that are feeding the logic of the integrated circuit design. Methods of determining cones of logic and circuit traversal analysis are well known in the art, and are therefore not described in detail herein.

At step 820, the process 800 of the present embodiment utilizes the results of the circuit traversal analysis and selects partitioning points of the scan chain, and inserts reconfiguration circuitry (e.g., reconfiguring bypass muxes) accordingly. The result of the step 820 would be a netlist with dynamic scan chain (e.g., scan chain 500) 830.

At step 840, a test pattern generation process, is carried out to generate test patterns for the netlist 830. According to an embodiment of the present invention, the ATPG process of step 840 is analogous to process 600 and generates test patterns 850 that are specifically targeted at the dynamic scan chain. Thereafter, at step 860, other DFT/ATPG processes may be carried out to further compact the test data.

Figure 9:
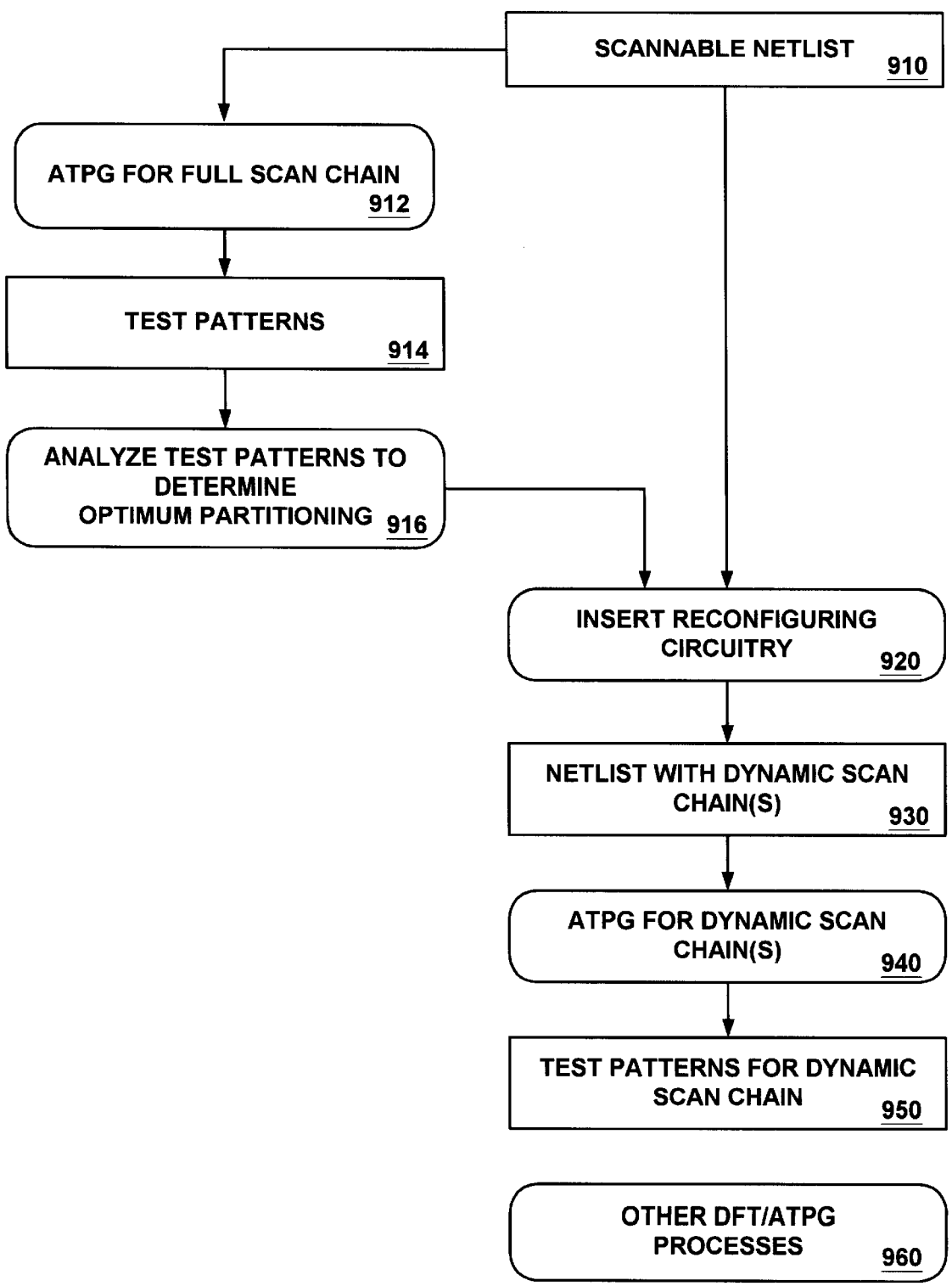
FIG. 9 is a flow chart diagram illustrating steps of a process of selecting reconfiguration points in furtherance of yet another embodiment of the present invention.

FIG. 9 is a flow chart diagram of a process 900 of selecting reconfiguration points in furtherance of yet another embodiment of the present invention. As illustrated, at step 912, an ATPG process is performed on a scannable netlist that includes a scan chain to generate test patterns 914. According to the present embodiment, the ATPG process 912 does not include a step of randomly filling unspecified positions in the test patterns 914. Rather, the test patterns 914 only includes deterministic test patterns (e.g., test patterns designed for testing specific faults).

At step 916, test patterns 914 are analyzed to determine optimal partitioning for the scan chain. Particularly, in one embodiment, step 916 of process 900 groups together test patterns that have similarly distributed specified and unspecified bits. For instance, some test patterns will only have specified bits in the first N positions, and some test patterns will have only specified bits in the last M positions of the test pattern. Step 916 is performed to determine whether such distribution of valuable bits exist in the test patterns 914.

At step 920, reconfiguration circuitry (e.g., reconfiguring bypass muxes) is inserted into the scannable netlist according to the results of the step 916, and a netlist with dynamic scan chain(s) 940 is generated.

At step 940, a test pattern generation process is carried out to generate test patterns for the netlist 930. According to an embodiment of the present invention, the ATPG process of step 940 is analogous to process 600 and generates test patterns 950 that are specifically targeted at the dynamic scan chain. Thereafter, at step 960, other DFT/ATPG processes may be carried out to further compact the test data.

The present invention, DFT and ATPG techniques for reducing test data volume, have thus been disclosed. The present invention decreases the number of ineffective randomly filled bits in the test patterns and thus reduces the overall test data volume. While the present invention has been described in particular embodiments, it should be appreciated that the present invention should not be construed as limited by such embodiments, but should be construed according to the claims below.

What is claimed is:

1. In a computer implemented test synthesis system, a method of implementing design for test circuitry within an integrated circuit design, said method comprising the steps of:
    a) accessing a netlist description of an integrated circuit design, said netlist description comprising a plurality of memory cells;
    b) replacing said plurality of memory cells with a plurality of scan cells;
    c) interconnecting said plurality of scan cells with a plurality of nets to form a scan chain;
    d) selecting a partition point from one of said plurality of nets, wherein said partition point segments said scan chain into a first segment and a second segment; and
    e) inserting a reconfiguration circuitry at said partition point, wherein said reconfiguration circuitry enables selectively coupling a truncated test pattern to an applicable one of said first segment or said second segment during test application, and wherein said truncated test pattern includes specified one or more of a plurality of bits applicable to one of said first segment or said second segment and excludes unspecified one or more of said plurality of bits inapplicable to one of said first segment or said second segment.

2. The method as recited in claim 1 wherein said step (d) further comprises the steps of:
    performing circuit traversal analysis on said netlist description of said integrated circuit design; and
    selecting said partition point based on results of said circuit traversal analysis.

3. The method as recited in claim 1 wherein said step (d) comprises the steps of:
    receiving deterministic test patterns generated for said integrated circuit design; and
    selecting said partition point based on said deterministic test patterns.

4. The method as recited in claim 1 wherein said step (d) comprises the step of randomly selecting said partition point.

5. The method as recited in claim 1 wherein said reconfiguration circuitry is configured for using both said first segment and said second segment during application of test patterns that require both said first segment and said second segment.

6. The method as recited in claim 1 wherein said reconfiguration circuitry comprises a plurality of multiplexers each configured for receiving a respective bypass control signal.

7. In a computer implemented test synthesis system, a method of testing an integrated circuit design, said method comprising the steps of:
    a) accessing a netlist description of an integrated circuit design having a dynamic scan chain, wherein said dynamic scan chain comprises a first segment, a second segment and reconfiguration logic;
    b) generating a test pattern for testing a potential fault of said integrated circuit design, said test pattern having a plurality of specified bits and a plurality of unspecified bits; and
    c) provided all of said plurality of specified bits are applicable to said first segment of said scan chain during test application, generating a first truncated test pattern by discarding respective said plurality of unspecified bits that are inapplicable to said first segment.

8. The method as described in claim 7 further comprising the steps of:
    bypassing said second segment of said dynamic scan chain by controlling said reconfiguration logic; and
    applying said first truncated test pattern to said first segment of said dynamic scan chain.

9. The method as described in claim 7 further comprising the step of randomly filling respective said plurality of unspecified bits that are applicable to said first segment.

10. The method as described in claim 7, further comprising the step of generating a second truncated test pattern by discarding respective said plurality of unspecified bits inapplicable to said second segment of said scan chain provided all of said plurality of specified bits are applicable to said second segment during test application.

11. The method as described in claim 10 further comprising the steps of:
    bypassing said first segment of said dynamic sacn chain by controlling said reconfiguration logic; and
    applying said second truncated test pattern to said second segment of said dynamic scan chain.

12. The method as described in claim 11 further comprising the step of randomly filling respective said plurality of unspecified bits that are applicable to said second segment.

13. The method as described in claim 11 further comprising the step of randomly filling said plurality of unspecified bits provided that said plurality of specified bits require both said first segment and said second segment for test application.

14. The method as described in claim 11 wherein said first truncated test pattern and said second truncated test pattern enables a reduction in total test data volume and test data application time for said integrated circuit design.

15. A system for implementing design for test circuitry within integrated circuit designs comprising:

a test synthesis system comprising:
  means for generating a scannable netlist based on a netlist description of an integrated circuit design; and
  means for inserting reconfiguration circuitry to form a dynamic scan chain, wherein said reconfiguration circuitry partitions said scannable netlist into a first segment and a second segment;

a test pattern generator comprising:
  means for generating a test vector for testing a potential fault of said integrated circuit design, said test vector having a plurality of specified bits and a plurality of unspecified bits;

means for determining whether said plurality of specified bits are applicable to said first segment of said dynamic scan chain; and means for generating a first truncated test pattern by discarding respective of said plurality of unspecified bits that are inapplicable to said first segment providing all of said plurality of specified bits are applicable to said first segment.

16. The system as recited in claim 15 wherein said reconfiguration circuitry enables said second segment to be selectively bypassed during application of test patterns that only require said first segment.

17. The system as recited in claim 16 wherein said reconfiguration circuitry enables said first segment to be selectively bypassed during application of test patterns that only require said second segment.

18. The system as recited in claim 17 wherein said reconfiguration circuitry is configured for using both of said first segment and said second segment during application of test patterns that require both of said first segment and said second segment.

19. The system as recited in claim 15 wherein said synthesis system includes means for performing circuit traversal analysis on said netlist description to determine a location of said reconfiguration circuit.

20. The system as recited in claim 15 wherein said synthesis system determines a location of said reconfiguration circuit randomly.

21. The system as recited in claim 15 wherein said test pattern generator further comprises means for generating a second truncated test pattern by discarding respective said plurality of unspecified bits that are inapplicable to said second segment provided all of said plurality of specified bits are applicable to said second segment.

* * * * *